(12) United States Patent
Fukushima et al.

(10) Patent No.: US 10,186,627 B2
(45) Date of Patent: Jan. 22, 2019

(54) CONDUCTOR CONNECTION MEMBER, CONNECTION STRUCTURE, AND SOLAR CELL MODULE

(71) Applicant: HITACHI CHEMICAL COMPANY, LTD., Tokyo (JP)

(72) Inventors: Naoki Fukushima, Ibaraki (JP); Isao Tsukagoshi, Tokyo (JP); Takehiro Shimizu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/596,581

(22) Filed: Jan. 14, 2015

(65) Prior Publication Data

US 2015/0200324 A1 Jul. 16, 2015

Related U.S. Application Data

(60) Division of application No. 12/615,251, filed on Nov. 9, 2009, now abandoned, which is a continuation of
(Continued)

(30) Foreign Application Priority Data

May 9, 2007 (JP) ............................... P2007-124439
Sep. 3, 2007 (JP) ............................... P2007-228035

(51) Int. Cl.
*H01L 31/18* (2006.01)
*H01L 31/042* (2014.01)
(Continued)

(52) U.S. Cl.
CPC ............... *H01L 31/18* (2013.01); *C09J 7/28* (2018.01); *C09J 9/02* (2013.01); *C09J 11/04* (2013.01);
(Continued)

(58) Field of Classification Search
CPC ............. H01L 31/18; H01L 31/022425; H01L 31/0512; C09J 9/02; C09J 11/04; C09J 7/18; C09J 7/28
See application file for complete search history.

(56) References Cited

U.S. PATENT DOCUMENTS 5,296,043 A 3/1994 Kawakami et al.
5,391,235 A 2/1995 Inoue
(Continued)

FOREIGN PATENT DOCUMENTS

CN 1532253 A 9/2004
CN 1632033 A 6/2005
(Continued)

OTHER PUBLICATIONS

Tsunomura et al., JP 2007-095941 A Online Machine Translation as provided by the Industrial Property Digital Library (IPDL) (accessed from http://www19.ipdl.inpit.go.jp/PA1/cgi-bin/PA1INDEX), translated on Jul. 17, 2013.*

(Continued)

Primary Examiner — Golam Mowla
(74) Attorney, Agent, or Firm — Griffin and Szipl PC

(57) ABSTRACT

The electric conductor connecting member of this invention comprises a metal foil having a roughened surface on at least one main side, and an adhesive layer formed on the roughened surface of the metal foil.

11 Claims, 8 Drawing Sheets

Related U.S. Application Data application No. PCT/JP2008/058486, filed on May 7, 2008.

(51) Int. Cl.
*C09J 9/02* (2006.01)
*C09J 11/04* (2006.01)
*H01L 31/0224* (2006.01)
*H01L 31/05* (2014.01)
*C09J 7/28* (2018.01)
*C08K 7/18* (2006.01)

(52) U.S. Cl.
CPC .. *H01L 31/022425* (2013.01); *H01L 31/0512* (2013.01); *C08K 7/18* (2013.01); *C09J 2201/602* (2013.01); *C09J 2205/102* (2013.01); *Y02E 10/50* (2013.01)

(56) References Cited

U.S. PATENT DOCUMENTS

| | | | |
|---|---|---|---|
| 5,509,557 | A | 4/1996 | Jimarez et al. |
| 5,847,316 | A | 12/1998 | Takada |
| 5,951,786 | A | 9/1999 | Gee et al. |
| 6,121,542 | A | 9/2000 | Shiotsuka et al. |
| 6,328,844 | B1 | 12/2001 | Watanabe et al. |
| 6,365,840 | B1 | 4/2002 | Honda et al. |
| 6,471,816 | B1 | 10/2002 | Shuto et al. |
| 6,593,522 | B2 | 7/2003 | Nakano et al. |
| 6,986,937 | B2 | 1/2006 | Yamazaki et al. |
| 2001/0005053 | A1 | 6/2001 | Kitae et al. |
| 2001/0037825 | A1 | 11/2001 | Nakano et al. |
| 2003/0178138 | A1 | 9/2003 | Tsukagoshi et al. |
| 2004/0151884 | A1 | 8/2004 | Higashitani |
| 2004/0161593 | A1 | 8/2004 | Yamazaki et al. |
| 2004/0200522 | A1 | 10/2004 | Fukawa et al. |
| 2004/0214979 | A1 | 10/2004 | Fujinawa et al. |
| 2005/0115602 | A1 | 6/2005 | Senta et al. |
| 2005/0202261 | A1 | 9/2005 | Takai et al. |
| 2006/0102228 | A1 | 5/2006 | Sridharan et al. |
| 2006/0272844 | A1 | 12/2006 | Berghofer et al. |
| 2007/0055039 | A1 | 3/2007 | Usui et al. |
| 2007/0095941 | A1 | 5/2007 | Gorres |
| 2007/0175579 | A1 | 8/2007 | Otani et al. |
| 2007/0235077 | A1 | 10/2007 | Nagata et al. |
| 2008/0121266 | A1 | 5/2008 | Tsunomura et al. |
| 2009/0293934 | A1 | 12/2009 | Okada et al. |
| 2010/0051338 | A1 | 3/2010 | Takai et al. |
| 2010/0116314 | A1 | 5/2010 | Fukushima et al. |
| 2011/0114256 | A1 | 5/2011 | Otani et al. |

FOREIGN PATENT DOCUMENTS

| | | | |
|---|---|---|---|
| CN | 1662120 | A | 8/2005 |
| CN | 1867602 | A | 11/2006 |
| CN | 1890339 | A | 1/2007 |
| JP | 58-135445 | | 9/1983 |
| JP | 63-50283 | Y2 | 12/1988 |
| JP | 1309206 | A | 12/1989 |
| JP | 8-3081 | | 1/1996 |
| JP | 11-16502 | A | 1/1999 |
| JP | 11-40225 | | 2/1999 |
| JP | 11-080682 | | 3/1999 |
| JP | 2000269637 | A | 9/2000 |
| JP | 2000286436 | A | 10/2000 |
| JP | 2000331537 | A | 11/2000 |
| JP | 2001323249 | A | 11/2001 |
| JP | 2001-343903 | A | 12/2001 |
| JP | 2001-345132 | A | 12/2001 |
| JP | 2001-345460 | A | 12/2001 |
| JP | 2002094090 | A | 3/2002 |
| JP | 2002-204052 | A | 7/2002 |
| JP | 2002280688 | A | 9/2002 |
| JP | 2004204256 | A | 7/2004 |
| JP | 2004-247402 | A | 9/2004 |
| JP | 2005-099693 | A | 4/2005 |
| JP | 2005101519 | A | 4/2005 |
| JP | 2005-243935 | A | 9/2005 |
| JP | 2006-28521 | A | 2/2006 |
| JP | 2006-059991 | | 3/2006 |
| JP | 3123842 | U | 7/2006 |
| JP | 2006-233203 | A | 9/2006 |
| JP | 2007-56209 | A | 3/2007 |
| JP | 2007-095941 | A | 4/2007 |
| JP | 2007-158302 | | 6/2007 |
| JP | 2007-214533 | | 8/2007 |
| JP | 6-265924 | A | 1/2018 |
| KR | 10-0563890 | B1 | 3/2006 |
| KR | 10-2006-0116451 | | 11/2006 |
| TW | 2005-05674 | A | 2/2005 |
| TW | I253979 | B | 5/2006 |
| TW | 602899 | B | 10/2017 |
| WO | 2006/051864 | A1 | 5/2006 |
| WO | 2007/055253 | A1 | 5/2007 |

OTHER PUBLICATIONS

Tsukakoshi et al., JP 6-350283 translation, Dec. 23, 1988.*
Machine English Translation of Kaneko JP 2001-343903.
Office Action issued in co-pending related U.S. Appl. No. 12/615,244 dated Mar. 16, 2015.
International Search Report, issued in corresponding application No. PCT/JP2008/058486, completed Aug. 6, 2008, dated Aug. 19, 2008.
Office Action issued in co-pending related Korean application 10-2009-7014260, dated Mar. 2, 2011.
Office Action issued in co-pending related Chiinese application 200880014826.6, dated Dec. 9, 2010.
"Surface Roughness—Definition and Designation," JIS B 0601-1994, JIS Rev Jan. 20, 2001, Revised Feb. 1, 1994, published by Japanese Standard Associations.
Office Action issued in a related Taiwanese Patent Application No. 097117008, dated May 30, 2011.
Office Action issued in a related Japanese Patent Application No. P2009-514130, dated Jun. 21, 2011.
Office Action dated Aug. 19, 2011 in counterpart Korean application 10-2011-7012768.
Office Action issued in counterpart Taiwanese application 097117347 dated Oct. 31, 2011.
International Preliminary Report on Patentability issued in related application PCT/JP2008/058488, dated Nov. 24, 2009 and mailed Dec. 3, 2009.
Office Action issued in co-pending related U.S. Appl. No. 12/615,244 dated Feb. 24, 2012.
Chen, S. et al. "Improvement of the adhesion of the resin to the metal surface by using plasma jet." Surface and Coatings Technology 97 (1997) pp. 378-384.
Notification of Information Provision issued in counterpart Japanese application 2009-514129 dated Apr. 24, 2012.
English abstract of JP 6-350283 A of Dec. 22, 1994 for "Electromagnetic Shielding Room," downloaded Nov. 5, 2012.
Office Action dated Oct. 24, 2012 in related Chinese application 200880013878.1.
Office Action issued in related Japanese application P2011-180849 dated Oct. 16, 2012.
Office Action issued in co-pending related U.S. Appl. No. 12/615,244 dated Dec. 6, 2012.
Office Action issued in related Japanese application 2012-102490 dated Jul. 2, 2013.
Office Action issued in related Chinese application 20111011270.X dated Jun. 25, 2013.
Exhibit F, which is a Machine English Translation of JP 2007-095941 A, obtained from the Japanese Patent Office website on Oct. 31, 2013.
Exhibit G, which is a Espacenet Bibliographic Data sheet, obtained from the European Patent Office website on Jul. 29, 2013, corresponding to JP 2007-095941 A.

(56) References Cited

OTHER PUBLICATIONS

Office action issued in a related Chinese patent application 200880013878.1 dated Nov. 18, 2013.
Office action issued in a related Chinese patent application 200880014826.6 dated Jan. 24, 2013.
Office Action issued in a related U.S. Appl. No. 13/835,018 dated Dec. 26, 2013.
Office Action issued in a related U.S. Appl. No. 12/615,244 dated Dec. 16, 2013.
Applicant-Initiated Interview Summary issued in co-pending related U.S. Appl. No. 13/835,018 dated Feb. 5, 2014.
JP 2001-323249 A Online Machine Translation as provided by the Industrial Property Digital Library (IPDL) (http://www19.ipdl.inpit.go.jp/PA 1/cgi-bin/PA 1INIT?1349487715613), translated on Oct. 5, 2012.
Office action issued in co-pending related U.S. Appl. No. 12/615,244 dated Oct. 7, 2016.
Final Office Action issued in co-pending related U.S. Appl. No. 12/615,244 dated Feb. 3, 2016.
Office Action issued in co-pending related U.S. Appl. No. 13/835,018 dated Jun. 29, 2016.
Office Action issued in related Chinese application 201610170188.3 dated Dec. 22, 2016 (no translation available; submitted for certification).
Final Office Action issued in related U.S. Appl. No. 12/615,244 dated Jun. 6, 2017.

\* cited by examiner

CONDUCTOR CONNECTION MEMBER, CONNECTION STRUCTURE, AND SOLAR CELL MODULE

RELATED APPLICATIONS

This application is a Divisional of U.S. patent application Ser. No. 12/615,251, filed Nov. 9, 2009, which is based upon and claims the benefit of priorities from International Application No. PCT/JP2008/058486 filed on May 7, 2008, Japanese Patent Application No. 2007-124439 filed on May 9, 2007, and Japanese Patent Application No. 2007-228035 filed on Sep. 3, 2007, the entire contents of which are incorporated herein by reference.

BACKGROUND OF THE INVENTION

Field of the Invention

The present invention relates to an electric conductor connecting member, a connection structure and a solar cell module.

Related Background Art

Solar cell modules have a construction wherein a plurality of solar cells are connected in series and/or in parallel via wiring members that are electrically connected to their surface electrodes. Solder has traditionally been used for connection between electrodes and wiring members (see Patent document 1, for example). Solder is widely used because of its excellent connection reliability, including conductivity and anchoring strength, low cost and general applicability.

Wiring connection methods that do not employ solder have been investigated, as well, from the viewpoint of environmental protection. For example, Patent documents 2 and 3 disclose connection methods employing paste-like or film-like conductive adhesives.

[Patent document 1] Japanese Unexamined Patent Publication No. 2004-204256

[Patent document 2] Japanese Unexamined Patent Publication No. 2000-286436

[Patent document 3] Japanese Unexamined Patent Publication No. 2005-101519

SUMMARY OF THE INVENTION

Problem to be Solved by the Invention

In the connection method employing solder described in Patent document 1, given a solder melting temperature of generally about 230-260° C., the high temperature of connection and the volume shrinkage of the solder adversely affect the solar cell semiconductor structure, tending to impair the characteristics of the fabricated solar cell module. In addition, the recent decreasing thicknesses of semiconductor boards have tended to result in even more cell cracking and warping. Moreover, because solder connection does not allow easy control of the distance between electrodes and wiring members, it has been difficult to obtain satisfactory dimensional precision for packaging. When sufficient dimensional precision cannot be achieved, product yield tends to be reduced during the packaging process.

On the other hand, methods of establishing connection between electrodes and wiring members using conductive adhesives, as described in Patent documents 2 and 3, allow bonding to be achieved at low temperature compared to using solder, thus potentially reducing the adverse effects on solar cells by heating at high temperature. In order to fabricate a solar cell module by this method, however, it is necessary to repeat a step of first applying or laminating a paste-like or film-like conductive adhesive on a solar cell electrode to form an adhesive layer and then positioning and subsequently bonding a wiring member on the formed adhesive layer, for each electrode. The connection step is therefore complex, resulting in reduced productivity for solar cell modules. The methods described in Patent documents 2 and 3 do not take into account the effect of the surface condition of the adherend, and in some cases it has not been possible to obtain sufficient connection reliability (especially connection reliability with high-temperature, high-humidity).

It is an object of the present invention, which has been accomplished in light of these circumstances, to provide an electric conductor connecting member which can simplify the connection steps for electrical connection between mutually separate electric conductors, while also obtaining excellent connection reliability. It is a further object of the invention to provide a connection structure and solar cell module whereby excellent productivity and high connection reliability can both be achieved.

Means for Solving the Problems

In order to solve the problems mentioned above, the invention provides an electric conductor connecting member comprising a metal foil having a roughened surface on at least one main side, and an adhesive layer formed on the roughened surface of the metal foil.

According to the electric conductor connecting member of the invention it is possible to electrically connect and bond a metal foil and electric conductors by placing part of the electric conductor connecting member with the roughened surface facing an electric conductor to be connected, hot pressing it in the facing direction, and hot pressing a different part of the electric conductor connecting member with another electric conductor in the same manner, thus allowing simplification of the connection steps for electrical connection between mutually separate electric conductors, while also obtaining excellent connection reliability.

The present inventors believe that the reason for this effect is that the electric conductor connecting member of the invention having such a construction allows an adhesive layer with controlled thickness to be easily formed between electric conductors and metal foils serving as wiring members in electrical connection with each electric conductor, allows satisfactory bonding and connection of electric conductors and metal foils at lower temperature (particularly at 200° C. and below) than when using solder, and sufficiently minimizes cracking and warping of electric conductor-formed substrates, while also reducing the effects of the surface condition of the electric conductors by facilitating conduction between the electric conductors and metal foils due to the protrusions on the roughened surface of the metal foil.

From the viewpoint of improving the conductivity between the electric conductors and metal foil, the thickness t (μm) of the adhesive layer is preferably no greater than 3 times Ry, where Ry (μm) is the maximum height on the roughened surface on which the adhesive layer has been formed, in the electric conductor connecting member of the invention.

Throughout the present specification, the maximum height is the value calculated according to JIS-B0601-1994, and it is determined by observation with an ultradeep three-dimensional profile microscope (for example, a "VK- 8510" ultradeep three-dimensional profile microscope by Keyences), and calculation by imaging and analysis software. The thickness of the adhesive layer is the value measured with a micrometer.

The adhesive layer in the electric conductor connecting member of the invention preferably contains a latent curing agent.

The adhesive layer in the electric conductor connecting member of the invention also preferably contains conductive particles.

Also preferably, the adhesive layer contains conductive particles with the mean particle size D (μm) of the conductive particles being no greater than Ry, where Ry (μm) is the maximum height on the roughened surface on which the adhesive layer has been formed. This can produce an effect of increasing the number of contact points during connection to lower resistance, and can prevent inclusion of voids at the joints to further improve the connection reliability.

Also, when the adhesive layer contains conductive particles, preferably the maximum particle size $r_{max}$ (μm) of the conductive particles is no greater than the sum of Rza and Rzb, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer. The maximum particle size of the conductive particles may be set as described above depending on the surface roughness of the electric conductors to be connected and the surface roughness of the metal foils, so that sufficient adhesion and excellent conductivity can be obtained while using conductive particles with a wider particle size distribution, and so that improved connection reliability can be achieved at lower cost compared to using conductive particles of uniform particle size, which are often used for such purposes.

Throughout the present specification, the ten-point height of roughness profile is the value calculated according to JIS-B0601-1994, and it is determined by observation with an ultradeep three-dimensional profile microscope (for example, a "VK-8510" ultradeep three-dimensional profile microscope by Keyences), and calculation by imaging and analysis software.

Also, from the viewpoint of obtaining even higher connection reliability for the electric conductor connecting member of the invention, preferably the adhesive layer contains a latent curing agent and conductive particles, the mean particle size D (μm) of the conductive particles being no greater than Ry, where Ry (μm) is the maximum height on the roughened surface on which the adhesive layer has been formed, and the maximum particle size $r_{max}$ (μm) of the conductive particles being no greater than the sum of Rza and Rzb, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer.

When the adhesive layer contains a latent curing agent, the mean particle size Dc (μm) of the latent curing agent is preferably no greater than Ry, where Ry (μm) is the maximum height on the roughened surface on which the adhesive layer has been formed. By limiting the mean particle size of the latent curing agent to no greater than the maximum height on the roughened surface, it is possible to prevent loss of the latent curing agent function when the electric conductor connecting member has been subjected to pressure during storage, and to improve the adhesion while adequately maintaining the shelf life of the electric conductor connecting member. These conditions are particularly effective for guaranteeing the shelf life when the electric conductor connecting member is a wound-up tape.

The metal foil in the electric conductor connecting member of the invention is preferably band-shaped. This will provide an effect of simplifying the connection steps, and ensuring a fixed width matching the joint while also facilitating automation during contiguous connection in the lengthwise direction.

From the viewpoint of conductivity, corrosion resistance and flexibility, the metal foil used in the electric conductor connecting member of the invention is preferably one comprising at least one metal selected from among Cu, Ag, Au, Fe, Ni, Pb, Zn, Co, Ti, Mg, Sn and Al.

From the viewpoint of facilitating formation of the adhesive layer and maintaining roughness during working, the ten-point height of roughness profile Rza (μm) of the roughened surface in the electric conductor connecting member of the invention is preferably no greater than 30 μm.

The invention further provides a connection structure wherein the electric conductor connecting member of the invention and an electric conductor are situated with the roughened surface of the electric conductor connecting member and the electric conductor facing each other via an adhesive layer and are hot pressed for electrical connection and bonding of the metal foil and electric conductor.

Since a metal foil, as a wiring member, is electrically connected to the electric conductor by an electric conductor connecting member of the invention in the connection structure of the invention, the connection steps can be simplified and excellent connection reliability can be obtained. Such a connection structure according to the invention may be applied to electrical and electronic parts requiring wiring connection (especially solar cell modules), to improve part productivity and enhance connection reliability.

In the connection structure of the invention, the surface of the electric conductor connected to the metal foil preferably has surface roughness, and the protrusions on the surface roughness sections of the electric conductor are preferably in contact with the protrusions on the roughened surface of the metal foil.

The invention further provides a solar cell module comprising a plurality of solar cells with surface electrodes, wherein each of the solar cells are electrically connected together via a metal foil bonded to the surface electrodes with a bonding member, the surface of the metal foil in contact with the surface electrode is a roughened surface, and the metal foil is formed of an electric conductor connecting member according to the invention.

Since each of the solar cells is connected together via the metal foil formed of an electric conductor connecting member according to the invention in the solar cell module of the invention, production is facilitated and excellent connection reliability can be obtained. With the solar cell module of the invention, therefore, it is possible to obtain both excellent productivity and high connection reliability.

Also in a solar cell module of the invention, some or all of the sections of the metal foil other than the surface in contact with the surface electrode are preferably covered with a resin. This will help to effectively prevent electrical shorts due to contact between the metal foil and other conductive members, thus preventing corrosion of the metal foil and improving the durability of the metal foil.

When each of solar cells in the solar cell module of the invention are connected together in series by electric conductor connecting members comprising adhesive layers formed on both roughened surfaces of metal foils having roughened surfaces on both main sides, each of the adhesive layers can serve both functions for bonding between the metal foils and electrodes and as metal foil-covering resins, and such a solar cell module is highly reliable and convenient to produce.

DESCRIPTION OF THE PREFERRED EMBODIMENTS

Figure 1:
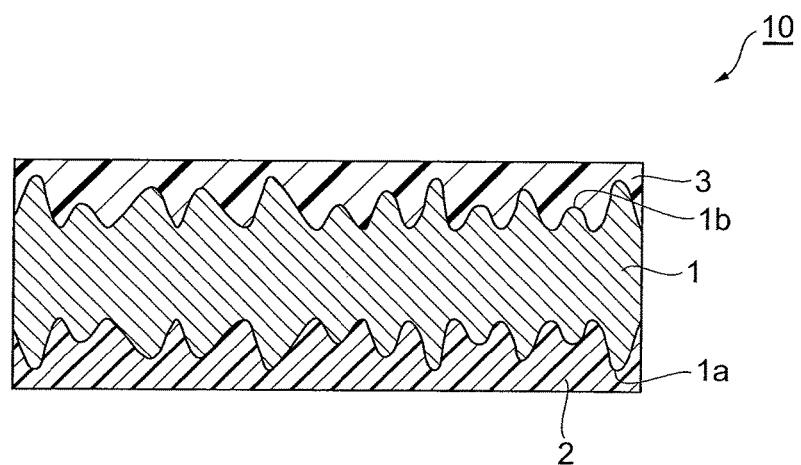
FIG. 1 is a schematic cross-sectional view showing an embodiment of an electric conductor connecting member according to the invention.

Preferred embodiments of the invention will now be explained in detail, with reference to the accompanying drawings as necessary. Through the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative.

Figure 2:
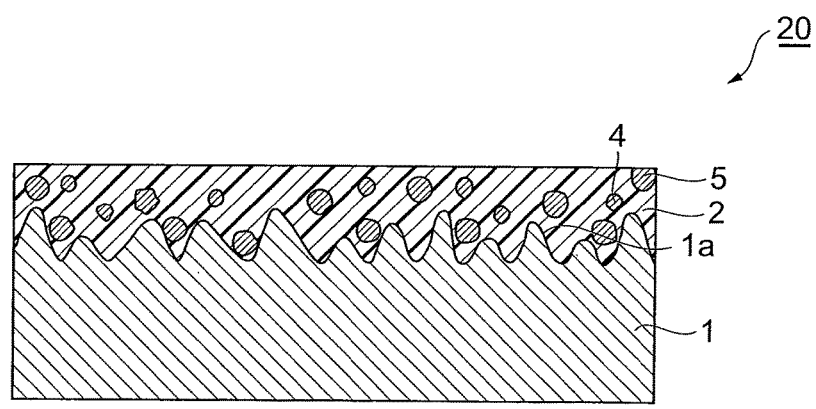
FIG. 2 is a schematic cross-sectional view showing another embodiment of an electric conductor connecting member according to the invention.

FIG. 1 is a schematic cross-sectional view showing an embodiment of an electric conductor connecting member according to the invention. The electric conductor connecting member 10 in FIG. 1 comprises a band-shaped metal foil 1 having roughened surfaces 1a, 1b on both main sides and a first adhesive layer 2 and second adhesive layer 3 formed on both roughened surfaces of the metal foil, and it has the form of an adhesive-attached metal foil tape. FIG. 2 is a schematic cross-sectional view showing another embodiment of an electric conductor connecting member according to the invention. The electric conductor connecting member 20 in FIG. 2 comprises a band-shaped metal foil 1 having a roughened surface 1a on one main side and a first adhesive layer 2 formed on the roughened surface of the metal foil. The adhesive layer 2 of the electric conductor connecting member 20 comprises a latent curing agent 4 and conductive particles 5.

When the electric conductor connecting member 10 having the adhesive layers formed on both sides of the metal foil is used to fabricate a solar cell module as described hereunder, it is easy to carry out the connecting step for connection between the solar cell surface electrode and the surface electrode (rear electrode) formed on the back side of the adjacent solar cell. That is, since adhesive layers are provided on both sides, connection can be established between the surface electrode and rear electrode without reversing the electric conductor connecting member. Also, because the adhesive layer that does not contribute to connection with the electrodes functions as a covering material for the metal foil, this helps to effectively prevent electrical shorts due to contact between the metal foil and other conductive members, thus preventing corrosion of the metal foil and improving the durability of the metal foil. This effect can be obtained even when the electric conductor connecting member 10 is used for connection between electric conductors formed on the same side.

On the other hand, the electric conductor connecting member 20 having an adhesive layer formed on one side of a metal foil facilitates fabrication of members and is superior in terms of cost, and consequently it is also suitable for connection between electric conductors formed on the same side.

The electric conductor connecting members 10, 20 are in the form of adhesive-attached metal foil tapes, and for winding up into a tape, it is preferred either to provide a separator such as a release sheet on the adhesive layer side or, in the case of the electric conductor connecting member 20, to provide a back side treatment layer of silicon or the like on the back side of the metal foil 1.

As examples for the metal foil 1 there may be mentioned those containing one or more metals selected from among Cu, Ag, Au, Fe, Ni, Pb, Zn, Co, Ti, Mg, Sn and Al, as well as laminates thereof. Copper and aluminum foils which have excellent conductivity are preferred for this embodiment.

The roughened surface of the metal foil 1 may be formed by a known surface roughening method such as, for example, a physical process using abrasive powder or a roll, or a chemical process by etching.

The thickness of the metal foil 1 may be about 5-150 µm. When the electric conductor connecting member of this embodiment is wound up as a tape, the thickness of the metal foil is preferably about 20-100 µm from the viewpoint of deformability and manageability. When the metal foil has a small thickness and lacks strength, it may be reinforced with a plastic film or the like.

The metal foil used for this embodiment may be a "electrolytic foil" having electrochemically heterogeneous microirregularities, for its ready availability. Electrolytic copper foils used for copper-clad laminates as printed circuit board materials are particularly preferred because they are readily available as general purpose materials, and economical. The electrolytic copper foil will generally be one having protrusions with base areas averaging approximately 10-500 µm².

There are no particular restrictions on the roughness of the roughened surface, but increased roughness may interfere with formation of the adhesive layer or may make it difficult to sufficiently maintain roughness during working, while insufficient roughness may result in unsatisfactory conductivity, and therefore the maximum height Ry is preferably 3 µm-35 µm. The maximum height Ry on the roughened surface is preferably no greater than 30 µm and more preferably no greater than 25 µm, from the viewpoint of facilitating formation of the adhesive layer and maintaining roughness during working. When the preferred roughness of the roughened surface is set by the ten-point height of roughness profile, the ten-point height of roughness profile Rza of the roughened surface is preferably no greater than 30 µm, more preferably no greater than 25 µm and even more preferably no greater than 15 µm.

The adhesive layers 2, 3 may be widely used materials formed using thermoplastic materials or curable materials that exhibit curable properties under heat or light. The adhesive layer for this embodiment preferably contains a curable material from the viewpoint of excellent heat resistance and humidity resistance after connection. Thermosetting resins may be mentioned as curable materials, and any publicly known ones may be used. As examples of thermosetting resins there may be mentioned epoxy resins, phenoxy resins, acrylic resins, phenol resins, melamine resins, polyurethane resins, polyester resins, polyimide resins, polyamide resins and the like. From the standpoint of connection reliability, the adhesive layer preferably contains at least one from among epoxy resins, phenoxy resins and acrylic resins.

The adhesive layers 2, 3 preferably comprise a thermosetting resin and a latent curing agent for the thermosetting resin. A latent curing agent has relatively distinct active points for reaction initiation by heat and/or pressure, and is suitable for connection methods that involve heating/pressing steps. The adhesive layers 2, 3 more preferably contain an epoxy resin and a latent curing agent for the epoxy resin. An adhesive layer formed from an epoxy-based adhesive containing a latent curing agent can be cured in a short period of time, has good workability for connection and exhibits excellent adhesion by its molecular structure.

As epoxy resins there may be mentioned bisphenol A-type epoxy resin, bisphenol F-type epoxy resin, bisphenol S-type epoxy resin, phenol-novolac-type epoxy resin, cresol-novolac-type epoxy resin, bisphenol A/novolac-type epoxy resin, bisphenol F/novolac-type epoxy resin, alicyclic epoxy resin, glycidyl ester-type epoxy resin, glycidyl amine-type epoxy resin, hydantoin-type epoxy resin, isocyanurate-type epoxy resin, aliphatic straight-chain epoxy resins and the like. These epoxy resins may be halogenated or hydrogenated. These epoxy resins may also be used in combinations of two or more.

As latent curing agents there may be mentioned anionic polymerizable catalyst-type curing agents, cationic polymerizable catalyst-type curing agents and polyaddition-type curing agents. Any of these may be used alone or in mixtures of two or more. Preferred among these are anionic and cationic polymerizable catalyst-type curing agents since they have excellent fast-curing properties and do not require special consideration in regard to chemical equivalents.

As examples of anionic or cationic polymerizable catalyst-type curing agents there may be mentioned tertiary amines, imidazoles, hydrazide-based compounds, boron trifluoride-amine complexes, onium salts (sulfonium salts, ammonium salts and the like), amineimides, diaminomaleonitrile, melamine and its derivatives, polyamine salts and dicyandiamides, as well as reformed compounds of the same. As polyaddition-type curing agents there may be mentioned polyamines, polymercaptanes, polyphenols, acid anhydrides and the like.

When a tertiary amine or imidazole is used as an anionic polymerizable catalyst-type curing agent, the epoxy resin is cured by heating at a moderate temperature of about 160° C.-200° C. for between several tens of seconds and several hours. This is preferred because it lengthens the pot life.

As cationic polymerizable catalyst-type curing agents there are preferred photosensitive onium salts that cure epoxy resins under energy ray exposure (mainly aromatic diazonium salts, aromatic sulfonium salts and the like). Aliphatic sulfonium salts are among those that are activated and cure epoxy resins by heat instead of energy ray exposure. Such curing agents are preferred because of their fast-curing properties.

Microcapsulated forms obtained by covering these curing agents with polyurethane-based or polyester-based polymer substances or inorganic materials such as metal thin-films of nickel or copper, or calcium silicate, are preferred as they can extend the pot life.

The active temperature of the adhesive layer is preferably 40-200° C. and more preferably 50-150° C. If the active temperature is below 40° C., the temperature difference against room temperature (25° C.) will be smaller and a low temperature will be required for storage of the connecting member, while if it is above 200° C. there will tend to be thermal effects on members other than those in the joints. The active temperature of the adhesive layer is the exothermic peak temperature upon temperature increase of the adhesive layer as the sample from room temperature at 10° C./min using a DSC (differential scanning calorimeter).

Setting a lower active temperature for the adhesive layer will tend to improve the reactivity but lower the storage life, and therefore it is preferably selected from both these considerations. That is, the electric conductor connecting member of this embodiment allows temporary connections to be made on electric conductors formed on boards, and allows metal foils and adhesive-attached boards to be obtained, by heat treatment at the active temperature of the adhesive layer. Furthermore, setting the active temperature of the adhesive layer within the range specified above can ensure an adequate storage life of the adhesive layer while facilitating highly reliable connection upon heating at above the active temperature. This allows more effective two-stage curing wherein temporarily connected articles are collectively cured together afterwards. When such temporarily connected articles are produced, there is virtually no viscosity increase in the adhesive layer as curing reaction proceeds at below the active temperature, and therefore the microirregularities in the electrodes are filled well and production can be more easily managed.

The electric conductor connecting member of this embodiment can exhibit conductivity in the thickness direction utilizing the roughness of the roughened surface of the metal foil, but the adhesive layer preferably contains conductive particles from the viewpoint of increasing the number of indentation surfaces during connection to increase the number of contact points.

There are no particular restrictions on the conductive particles, and for example, gold particles, silver particles, copper particles, nickel particles, gold-plated nickel particles, gold/nickel plated plastic particles, copper-plated particles and nickel-plated particles may be mentioned. The conductive particles preferably have burr-shaped or spherical particle shapes from the viewpoint of the filling properties of the conductive particles into the adherend surface irregularities during connection. Specifically, conductive particles in such a form have higher filling properties for complex irregular shapes on metal foil and adherend surfaces, as well as high shape-following properties for variation caused by vibration or expansion after connection, and can therefore improve the connection reliability.

The conductive particles used for this embodiment have a particle size distribution in the range of about 1-50 µm, and preferably 1-30 µm.

The content of conductive particles in the adhesive layer may be within a range that does not notably lower the adhesion of the adhesive layer, and for example, it may be up to 10 vol % and preferably 0.1-7 vol % based on the total volume of the adhesive layer.

When the adhesive layer of the electric conductor connecting member of this embodiment contains conductive particles, the mean particle size D (μm) of the conductive particles is preferably no greater than Ry, where Ry (μm) is the maximum height on the roughened surface on which the adhesive layer has been formed, from the viewpoint of achieving a high level for both the adhesion and conductivity. This can produce an effect of increasing the number of contact points during connection to lower resistance, and can prevent inclusion of voids at the joints to further improve the connection reliability.

Also, when the adhesive layer contains conductive particles, preferably the maximum particle size $r_{max}$ (μm) of the conductive particles is no greater than the sum of Rza and Rzb, and more preferably the maximum particle size $r_{max}$ (μm) of the conductive particles is no greater than Rza, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer. The maximum particle size of the conductive particles may be set as described above depending on the surface roughness of the electric conductors to be connected and the surface roughness of the metal foil, so that sufficient adhesion and excellent conductivity can be obtained while using conductive particles with a wider particle size distribution (in the range of 1-50 μm and preferably 1-30 μm, for example), and so that improved connection reliability can be achieved at lower cost compared to using conductive particles of uniform particle size, which are often used for such purposes.

Also, from the viewpoint of obtaining even higher connection reliability for the electric conductor connecting member of this embodiment, preferably the adhesive layer contains a latent curing agent and conductive particles, the mean particle size D (μm) of the conductive particles being no greater than Ry, where Ry (μm) is the maximum height on the roughened surface on which the adhesive layer has been formed, and the maximum particle size $r_{max}$ (μm) of the conductive particles being no greater than the sum of Rza and Rzb, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer.

When the adhesive layer in the electric conductor connecting member of this embodiment contains a latent curing agent, the mean particle size Dc (μm) of the latent curing agent is preferably no greater than Ry, where Ry (μm) is the maximum height on the roughened surface on which the adhesive layer has been formed. By limiting the mean particle size of the latent curing agent to no greater than the maximum height on the roughened surface, it is possible to prevent loss of the latent curing agent function when the electric conductor connecting member has been subjected to pressure during storage, and to improve the adhesion while adequately maintaining the shelf life of the electric conductor connecting member. These conditions are particularly effective for guaranteeing the shelf life when the electric conductor connecting member is a wound-up tape.

When the adhesive layer contains a latent curing agent and conductive particles, the mean particle size Dc of the latent curing agent is preferably smaller than the mean particle size D of the conductive particles, from the standpoint of extending the storage life and obtaining both adhesion and conductivity by a smoother adhesive layer surface. Throughout the present specification, the mean particle size D of the conductive particles is the value determined by the following formula. The mean particle size Dc of the latent curing agent is the value determined in the same manner.

$$D = \Sigma nd / \Sigma n \qquad \text{[Formula 1]}$$

Here, n represents the number of particles with maximum diameter d. The method of measuring the particle size may be an electron microscope, optical microscope, Coulter counter or light scattering method, all of which are commonly employed. When the particles have an aspect ratio, d is the center diameter. According to the invention, measurement is preferably conducted on at least 10 particles using an electron microscope.

According to this embodiment, the thickness of the adhesive layer is appropriately set based on the average distance from the bottom sections (concavities) of the roughened surface, but it is preferably thicker from the viewpoint of adhesion, and thinner from the viewpoint of conductivity. In consideration of both these properties, the thickness of the adhesive layer is preferably about 5-50 μm, and it is more preferably 9-45 μm from the viewpoint of further improving the connection reliability.

The thickness t (μm) of the adhesive layer in the electric conductor connecting member of this embodiment is preferably set according to the surface condition of the electric conductor to be connected. Surface conditions of electric conductors are largely classified into 3 types, and the preferred adhesive layer thicknesses for each type will now be explained with reference to the accompanying drawings.

Figure 3:
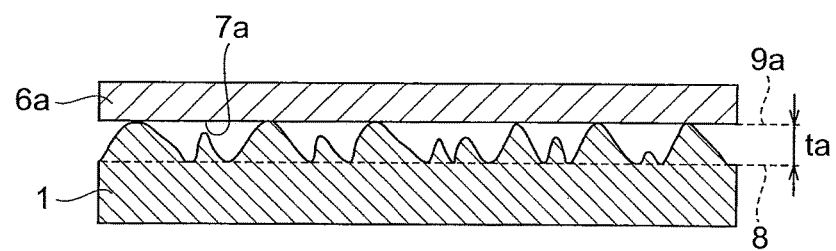
FIG. 3 is an illustration showing the relationship between the surface roughness of an electrode to be connected and the surface roughness on the roughened surface of the metal foil, and the thickness of the adhesive layer.
Figure 4:
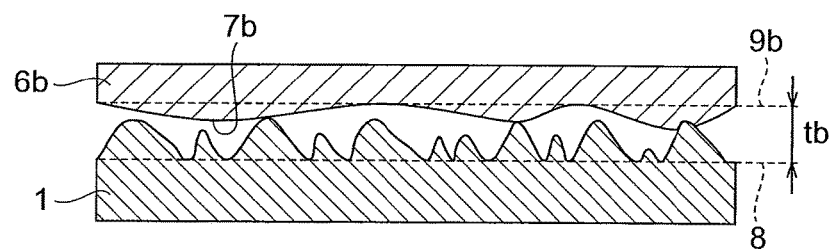
FIG. 4 is an illustration showing the relationship between the surface roughness of an electrode to be connected and the surface roughness on the roughened surface of the metal foil, and the thickness of the adhesive layer.
Figure 5:
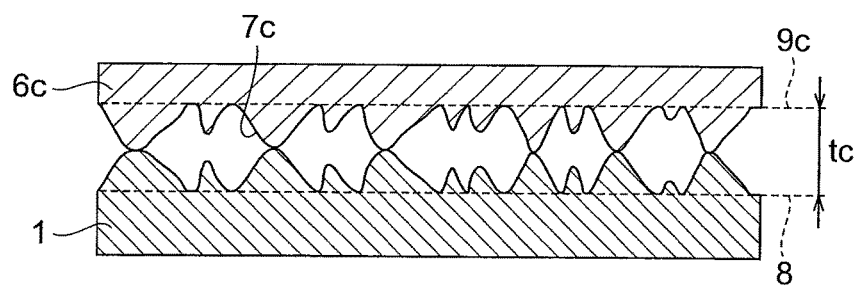
FIG. 5 is an illustration showing the relationship between the surface roughness of an electrode to be connected and the surface roughness on the roughened surface of the metal foil, and the thickness of the adhesive layer.

FIGS. 3 to 5 are illustrations showing the relationship between the surface roughness of an electrode to be connected and the surface roughness on the roughened surface of the metal foil, and the thickness of the adhesive layer. FIG. 3 shows a case where the electric conductor to be connected is an electrode 6a having an essentially smooth adherend surface 7a. FIG. 5 shows a case where the electric conductor to be connected is an electrode 6c having an adherend surface 7c with approximately the same roughness as the maximum height Ry of the roughened surface of the metal foil. FIG. 4 shows a case where the electric conductor to be connected is an electrode 6b having an adherend surface 7b with a medium level of roughness between the essentially smooth adherend surface 7a shown in FIG. 3 and the adherend surface 7c having approximately the same roughness as the maximum height Ry of the roughened surface of the metal foil shown in FIG. 5.

In the case of FIG. 3, the thickness ta (μm) of the adhesive layer is preferably set so as to be approximately the same as the maximum height Ry (μm) of the roughened surface of the metal foil, so that the areas between the bottom sections 9a of the adherend surface 7a and the bottom sections 8 of the roughened surface of the metal foil 1 are sufficiently filled with the adhesive when the protrusions of the roughened surface of the metal foil 1 contact with the adherend surface 7a. Specifically, the thickness ta of the adhesive layer is preferably set with a safety margin around approximately the same value as the maximum height (μm) of the surface of the electric conductor in contact with the adhesive layer (a value such that ta/Ry=approximately 1.0), as the center value. The safety margin may be set in consideration of factors such as the shape and roughness of the electrode surface as the electric conductor to be connected, the roughness and shape of the metal foil, the flow properties of the adhesive layer and the amount of seepage of the adhesive during connection. For this embodiment, the range for the safety margin is preferably set so that ta/Ry is in the range of approximately 0.7-1.2. This is preferred to further exploit the irregularities in the roughened surface of the metal foil.

In the case of FIG. 4, the thickness tb (μm) of the adhesive layer is preferably set so as to be about 1-2 times the maximum height Ry (μm) of the roughened surface of the metal foil, so that the areas between the bottom sections 9b of the adherend surface 7b and the bottom sections 8 of the roughened surface of the metal foil 1 are sufficiently filled with the adhesive when the protrusions of the roughened surface of the metal foil 1 contact with the adherend surface 7b.

In the case of FIG. 5, the thickness tc (μm) of the adhesive layer is preferably set so as to be about 2-3 times the maximum height Ry (μm) of the roughened surface of the metal foil, so that the areas between the bottom sections 9c of the adherend surface 7c and the bottom sections 8 of the roughened surface of the metal foil 1 are sufficiently filled with the adhesive when the protrusions of the roughened surface of the metal foil 1 contact with the adherend surface 7c.

In consideration of the effect of the surface roughness of the electric conductor, in the case shown in FIG. 3, and in the cases shown in FIG. 4 and FIG. 5 wherein conductivity is obtained by contact of irregularly shaped microirregularities, and also the flow property of the adhesive, the thickness t (μm) of the adhesive layer is preferably, for higher connection reliability, no greater than 3 times and more preferably 0.7-3 times Ry, where Ry (μm) is the maximum height on the roughened surface on which the adhesive layer has been formed. If the thickness t (μm) of the adhesive layer is greater than 3 times Ry, it will be difficult to obtain sufficient conductivity. If the thickness t (μm) of the adhesive layer is less than 0.7 times Ry, it will be difficult to obtain sufficient adhesion.

The present inventors believe that the reason for the tendency toward high connection reliability by setting the thickness of the adhesive layer based on the maximum height on the roughened surface of the metal foil as described above, is that the spacing between the metal foil and electric conductor is largely dependent on the largest section among the difference of elevation in the roughness consisting of irregularities on the surface of the metal foil, i.e. Ry, and therefore setting the thickness of the adhesive layer based on Ry can reliably and easily achieve both filling properties and conductivity even when variations are present in the surface condition of the electric conductor.

The adhesive layers 2, 3 may also contain, in addition to the components mentioned above, modifying materials such as silane-based coupling agents, titanate-based coupling agents or aluminate-based coupling agents in order to improve the adhesion or wettability between the curing agent, curing accelerator and substrate on which the electric conductor is formed, dispersing agents such as calcium phosphate or calcium carbonate in order to improve the dispersibility of the conductive particles, and chelate materials to prevent silver or copper migration.

The electric conductor connecting member of the embodiment described above may be placed on the electric conductor and hot pressed to bond the metal foil and electric conductor while achieving conduction with low resistance of no greater than about $10^{-1}$ $\Omega/cm^2$ between the metal foil and electric conductor during electrification.

The electric conductor connecting member of this embodiment is suitable as a connecting member for connection between multiple solar cells in series and/or parallel.

An electric conductor connection method employing an electric conductor connecting member according to this embodiment will now be described.

The electric conductor connection method of the first embodiment is a method for electrical connection between a mutually separate first electric conductor and second electric conductor using the electric conductor connecting member 10, and it comprises a first step in which part of the electric conductor connecting member 10 and a first electric conductor are situated with the roughened surface 1a of the electric conductor connecting member 10 and the first electric conductor facing each other via a first adhesive layer 2, and these are hot pressed for electrical connection and bonding of the metal foil 1 and first electric conductor, and a second step in which another part of the electric conductor connecting member 10 and a second electric conductor are situated with the roughened surface 1b of the electric conductor connecting member 10 and the second electric conductor facing each other via a second adhesive layer 3, and these are hot pressed for electrical connection and bonding of the metal foil 1 and second electric conductor. The first electric conductor and second electric conductor thus become electrically connected via the metal foil 1 bonded to the electric conductors. The electric conductor connection method of this embodiment is suitable for connection of multiple solar cells in series, for example.

The first step and second step may be carried out simultaneously or in the order of first step and second step, or in the reverse order. The second step may alternatively be a step in which the other part of the electric conductor connecting member 10 and the second electric conductor are situated so that the roughened surface 1a of the electric conductor connecting member 10 and the second electric conductor are facing each other via the first adhesive layer 2, and these are hot pressed to electrically connect and bond the metal foil 1 and second electric conductor. This is preferred when, for example, multiple solar cells are connected in parallel.

The electric conductor connection method of the second embodiment is a method for electrical connection between a mutually separate first electric conductor and second electric conductor using the electric conductor connecting member 20, and it comprises a first step in which part of the electric conductor connecting member 20 and a first electric conductor are situated with the roughened surface 1a of the electric conductor connecting member 20 and the first electric conductor facing each other via a first adhesive layer 2, and these are hot pressed for electrical connection and bonding of the metal foil 1 and first electric conductor, and a second step in which another part of the electric conductor connecting member 20 and a second electric conductor are situated with the roughened surface 1a of the electric conductor connecting member 20 and the second electric conductor facing each other via the first adhesive layer 2, and these are hot pressed for electrical connection and bonding of the metal foil 1 and second electric conductor. The first electric conductor and second electric conductor thus become electrically connected via the metal foil 1 bonded to the electric conductors. The first step and second step may be carried out simultaneously or in the order of first step and second step, or in the reverse order. The electric conductor connection method of this embodiment is suitable for connection of multiple solar cells in parallel, for example.

As examples of electric conductors for the electric conductor connection method of the first embodiment and second embodiment described above, there may be mentioned solar cell bus electrodes, electromagnetic wave shield wiring or ground electrodes, semiconductor electrodes for short modes, and display electrodes.

As known materials that can be used to obtain electrical conduction for solar cell bus electrodes, there may be mentioned ordinary silver-containing glass paste, or silver paste, gold paste, carbon paste, nickel paste or aluminum paste obtained by dispersing conductive particles in adhesive resins, and ITO formed by firing or vapor deposition, but silver-containing glass paste electrodes are preferred from the viewpoint of heat resistance, conductivity, stability and cost. Solar cells generally have an Ag electrode and an Al electrode formed by screen printing or the like, on a semiconductor board composed of one or more Si single-crystal, polycrystal or amorphous materials. The electrode surfaces generally have irregularities of 3-30 μm. In particular, the electrodes formed on solar cells have a maximum height Ry of about 30 μm and are often rough with a ten-point height of roughness profile Rz of about 2-30 μm, and usually 2-18 μm.

When the adhesive layer for the electric conductor connection method of the first embodiment and second embodiment contains conductive particles, the mean particle size D (μm) of the conductive particles is preferably no greater than Ry, where Ry (μm) is the maximum height on the roughened surface on which the adhesive layer has been formed, from the viewpoint of achieving a high level for both the adhesion and conductivity. Also, when the adhesive layer contains conductive particles, preferably the maximum particle size $r_{max}$ (μm) of the conductive particles is no greater than the sum of Rza and Rzb, and more preferably the maximum particle size $r_{max}$ (μm) of the conductive particles is no greater than Rza, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer. Furthermore, the thickness t (μm) of the adhesive layer is preferably, for higher connection reliability, no greater than 3 times and more preferably 0.7-3 times Ry, where Ry (μm) is the maximum height on the roughened surface on which the adhesive layer has been formed.

Also, from the viewpoint of obtaining even higher connection reliability in the electric conductor connection method of this embodiment, preferably the adhesive layer contains a latent curing agent and conductive particles, the mean particle size D (μm) of the conductive particles being no greater than Ry, where Ry (μm) is the maximum height on the roughened surface on which the adhesive layer has been formed, and the maximum particle size $r_{max}$ (μm) of the conductive particles being no greater than the sum of Rza and Rzb, where Rza (μm) is the ten-point height of roughness profile on the roughened surface on which the adhesive layer has been formed and Rzb (μm) is the ten-point height of roughness profile on the surface of the electric conductor to be connected, which is in contact with the adhesive layer. When the adhesive layer contains a latent curing agent, the mean particle size Dc (μm) of the latent curing agent is preferably no greater than Ry, where Ry (μm) is the maximum height on the roughened surface on which the adhesive layer has been formed.

The conditions for the heating temperature and pressing pressure are not particularly restricted so long as they are within a range that can ensure electrical connection between the metal foil and electric conductor and that allows bonding of the electric conductor and metal foil by the adhesive layer. The pressing and heating conditions are appropriately selected according to the purpose of use, the components in the adhesive layer and the material of the substrate on which the electric conductor is to be formed. For example, when the adhesive layer contains a thermosetting resin, the heating temperature may be a temperature at which the thermosetting resin cures. The pressing pressure may be in a range that sufficiently bonds the electric conductor and metal foil and does not damage the electric conductor or metal foil. Also, the heating and pressing time may be a time that does not cause excessive heat transfer to the substrate on which the electric conductor is formed, to avoid damage to or deterioration of the material. Specifically, the pressing pressure is preferably 0.1 MPa-10 MPa, the heating temperature is preferably 100° C.-220° C. and the heating/pressing time is preferably no longer than 60 seconds. These conditions are more preferably toward lower pressure, lower temperature and a shorter time.

Figure 6:
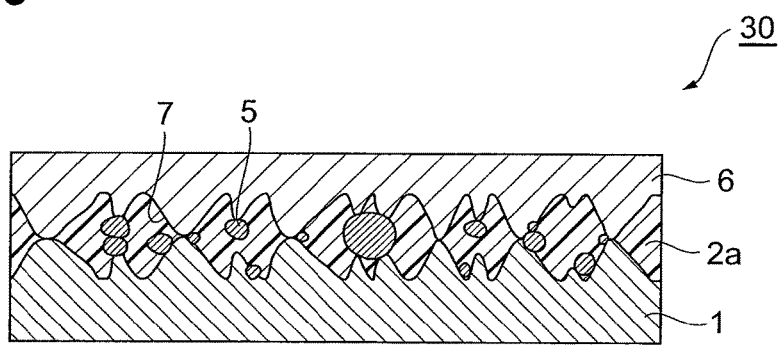
FIG. 6 is a schematic cross-sectional view showing a connection structure according to this embodiment.

FIG. 6 is a schematic cross-sectional view showing a connection structure according to the invention. The connection structure 30 shown in FIG. 6 is obtained by situating a portion of the conductive connecting member 20 (adhesive-attached metal foil tape) of this embodiment and an electrode as the electric conductor with the roughened surface of the electric conductor connecting member and the electrode facing each other via the adhesive layer, and hot pressing them, and it has a structure wherein part of the protrusions on the roughened surface of the metal foil 1 of the conductive connecting member 20 directly contacts the protrusions of the electrode 6 while the metal foil 1 and electrode 6 are bonded by the cured product 2a of the adhesive layer 2. In the connection structure 30, contact points with the conductive particles 5 are increased, in addition to the contacts between part of the protrusions on the roughened surface of the metal foil 1 and the protrusions of the electrode 4. According to this connection structure, the metal foil 1 and the adherend surface 7 of the electrode 6 are kept anchored by the adhesive force or cure shrinkage force of the adhesive, thus stably maintaining the conductivity obtained between the metal foil 1 and electrode 6 and allowing sufficient connection reliability to be achieved between electric conductors.

As explained above, the electric conductor connecting member of this embodiment is suitable as a connecting member for connection between multiple solar cells in series and/or parallel. The solar battery may have a construction that includes a solar cell module comprising a plurality of solar cells connected in series and/or in parallel and sandwiched between tempered glass or the like for environmental resistance, and provided with external terminals wherein the gaps are filled with a transparent resin.

Figure 7:
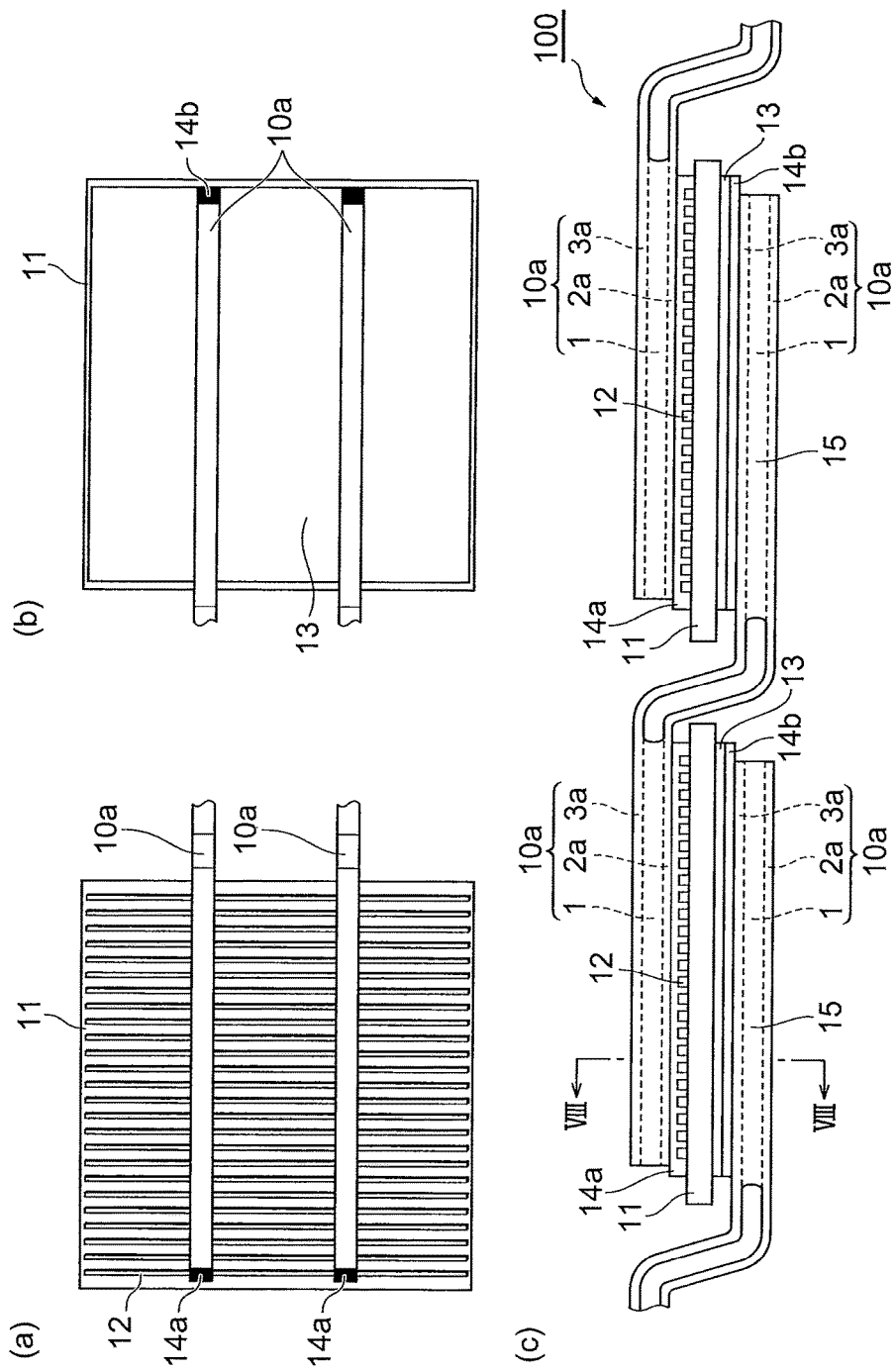
FIG. 7 is a schematic view of the essential part of a solar cell module according to this embodiment.

FIG. 7 is a schematic drawing showing the essential parts of a solar cell module according to this embodiment, as an overview of a structure with reciprocally wire-connected solar cells. FIG. 7(a) shows the front side of the solar cell module, FIG. 7(b) shows the rear side, and FIG. 7(c) shows an edge view.

As shown in FIGS. 7(a)-(c), the solar cell module 100 has solar cells, with grid electrodes 12 and bus electrodes (surface electrodes) 14a formed on the front side of a semiconductor wafer 11 and rear electrodes 13 and bus electrodes (surface electrodes) 14b formed on the rear side, the solar cells being reciprocally connected by wiring members 10a. The wiring members 10a each have one end connected to a bus electrode 14a as a surface electrode and the other end connected to a bus electrode 14b as a surface electrode. Each of the wiring members 10a is formed using a conductive connecting member 10. Specifically, one end of the conductive connecting member 10 is placed on the bus electrode 14a with the roughened surface 1a of the electric conductor connecting member 10 and the bus electrode 14a facing each other via the first adhesive layer 2, and these are hot pressed in the facing direction, while the other end of the conductive connecting member 10 is placed on the bus electrode 14b with the roughened surface 1b of the electric conductor connecting member 10 and the bus electrode 14b facing each other via the second adhesive layer 3, and these are hot pressed in the facing direction, to form the wiring member 10a.

According to this embodiment, the metal foil 1 and bus electrode 14a, and the metal foil 1 and bus electrode 14b, may be connected via conductive particles.

Figure 8:
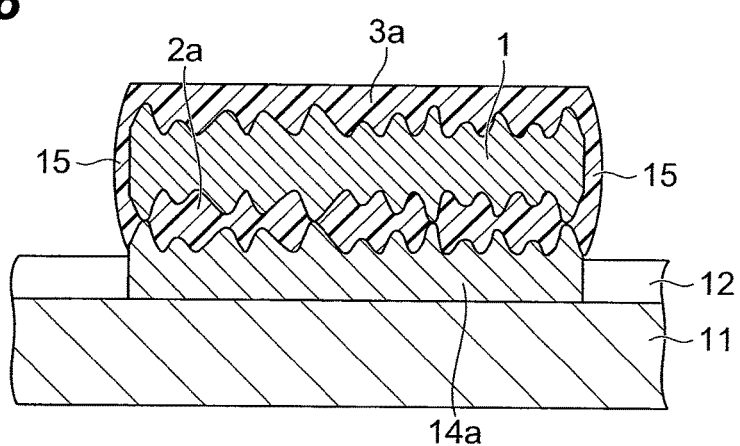
FIG. 8 is a schematic cross-sectional view showing part of a solar cell module according to this embodiment.

FIG. 8 is a cross-sectional view of the solar cell module shown in FIG. 7(c), along line VIII-VIII. FIG. 8 shows only the front side of the semiconductor wafer 11, omitting the structure of the rear side. The solar cell module of this embodiment is fabricated through a step in which one end of the conductive connecting member 10 is placed on the bus electrode 14a and hot pressed, and it has a structure wherein the metal foil 1 and bus electrode 14a are electrically connected while being bonded by the cured product 2a of the adhesive layer 2 filling the surface roughness sections of the bus electrode 14a. Also according to this embodiment, the sections of the metal foil 1 other than the surface in contact with the bus electrode 14a are covered by the cured adhesive (preferably resin). Specifically, the surface of the metal foil 1 opposite the side in contact with the bus electrode 14a is covered by the cured product 3a of the second adhesive layer 3, and the edges of the metal foil 1 are covered by the cured product 15 of the adhesive (excess adhesive) that has seeped out by hot pressing during connection. In this type of structure, electrical shorts due to contact between the metal foil and other conductive members can be effectively prevented, thus preventing corrosion of the metal foil and improving the durability of the metal foil.

If the conductive connecting member 10 is in the form of a tape as for this embodiment, the width of the member is extremely small compared to the lengthwise direction, and therefore seepage of the adhesive in the direction of the metal foil edges can be increased, thus making it easier to obtain a reinforcing effect on the strength of the joints.

The embodiments described above are preferred embodiments of the invention, but the invention is not limited thereto. The invention may also be applied in a variety of modifications so long as the gist thereof is maintained.

The electric conductor connecting member of the invention can be applied not only for fabrication of the solar battery as described above, but also for fabrication of, for example, short modes of electromagnetic wave shields, tantalum condensers and the like, aluminum electrolytic condensers, ceramic condensers, power transistors, various types of sensors, MEMS-related materials and lead wiring members for display materials.

EXAMPLES

The present invention will now be explained in greater detail with reference to examples, with the understanding that the invention is not meant to be limited to these examples.

Example 1

(1) Fabrication of Adhesive-Attached Metal Foil Tape (Electric Conductor Connecting Member)

As a film-forming material, 50 g of a phenoxy resin (trade name: "PKHA" by Inchem, high molecular weight epoxy resin with molecular weight of 25,000) and 20 g of an epoxy resin (trade name: "EPPN" by Nihon Kayaku Co., Ltd.) were dissolved in 175 g of ethyl acetate to obtain a solution. Next, 5 g of a master batch-type curing agent (trade name: "NOVACURE" by Asahi Kasei Corp., mean particle size: 2 µm) comprising imidazole-based microcapsules dispersed in a liquid epoxy resin was added to the solution as a latent curing agent, to obtain an adhesive layer-forming coating solution with a solid content of 30 wt %. The active temperature of the coating solution was 120° C.

The adhesive layer-forming coating solution was then coated onto both sides of a double-side roughened electrolytic copper foil (thickness: 35 µm, ten-point height of roughness profile Rza: 12 µm, maximum height Ry: 13 µm) using a roll coater, and the coated foil was dried at 110° C. for 5 minutes to form an adhesive layer with a thickness of 14 µm, to obtain a laminated body.

The laminated body was wound up into a roll while taking up a polyethylene film as a separator on the adhesive layer. The wound roll was cut to a width of 2.0 mm to obtain an adhesive-attached metal foil tape.

(2) Connection of Solar Cells using Conductive Adhesive-Attached Metal Foil Tape There were prepared a solar cell (thickness: 150 µm, size: 15 cm×15 cm) comprising a surface electrode (width: 2 mm×length: 15 cm, ten-point height of roughness profile Rzb: 2 µm, maximum height Ry: 13 µm) formed from silver glass paste on the surface of a silicon wafer.

Next, the obtained adhesive-attached metal foil tape was positioned on a solar cell surface electrode and a contact bonding tool (AC-S300 by Nikka Equipment & Engineering Co., Ltd.) was used for hot pressing at 170° C., 2 MPa, 20 seconds to accomplish bonding. This yielded a connection structure wherein the electrolytic copper foil wiring member was connected to the solar cell surface electrode via the conductive adhesive film.

Example 2

An adhesive-attached metal foil tape was obtained in the same manner as Example 1, except for adding 2 vol % of burr-shaped Ni powder with a particle size distribution width of 1-12 µm (mean particle size: 7 µm) to the adhesive layer-forming coating solution. The adhesive-attached metal foil tape was used to obtain a connection structure in the same manner as Example 1. The added conductive particles are particles that have not been treated for uniformity of particle size, and thus have a wide particle size distribution as explained above.

Example 3

An adhesive-attached metal foil tape was obtained in the same manner as Example 1, except that a single-side roughened copper foil with a thickness of 100 µm (ten-point height of roughness profile on roughened surface Rza: 12 µm, maximum height Ry: 13 µm) was used as the metal foil, and an adhesive layer was formed on the roughened surface of the copper foil. The adhesive-attached metal foil tape was then positioned on the surface electrode with the roughened surface and surface electrode facing each other, and a connection structure was obtained in the same manner as Example 1.

Example 4

An adhesive-attached metal foil tape was obtained in the same manner as Example 1, except that a single-side roughened aluminum foil with a thickness of 20 μm (ten-point height of roughness profile on roughened surface Rza: 12 μm, maximum height Ry: 13 μm) was used as the metal foil, and an adhesive layer was formed on the roughened surface of the aluminum foil. The adhesive-attached metal foil tape was then positioned on the surface electrode with the roughened surface and surface electrode facing each other, and a connection structure was obtained in the same manner as Example 1.

Example 5

An adhesive-attached metal foil tape was obtained in the same manner as Example 1, except that a double-side roughened electrolytic copper foil with a thickness of 75 μm (ten-point height of roughness profile on roughened surface Rza: 2 μm, maximum height Ry: 3 μm) was used as the metal foil, and the thickness of the adhesive layer was 9 μm. The adhesive-attached metal foil tape was used to obtain a connection structure in the same manner as Example 1.

Example 6

An adhesive-attached metal foil tape was obtained in the same manner as Example 1, except that a double-side roughened electrolytic copper foil with a thickness of 75 μm (ten-point height of roughness profile on roughened surface Rza: 9 μm, maximum height Ry: 10 μm) was used as the metal foil, and the thickness of the adhesive layer was 18 μm. The adhesive-attached metal foil tape was used to obtain a connection structure in the same manner as Example 1.

Example 7

An adhesive-attached metal foil tape was obtained in the same manner as Example 1, except that a double-side roughened electrolytic copper foil with a thickness of 75 μm (ten-point height of roughness profile on roughened surface Rza: 20 μm, maximum height Ry: 25 μm) was used as the metal foil, and the thickness of the adhesive layer was 20 μm. The adhesive-attached metal foil tape was used to obtain a connection structure in the same manner as Example 1.

Example 8

An adhesive-attached metal foil tape was obtained in the same manner as Example 1, except that a double-side roughened electrolytic copper foil with a thickness of 75 μm (ten-point height of roughness profile on roughened surface Rza: 20 μm, maximum height Ry: 25 μm) was used as the metal foil, the thickness of the adhesive layer was 45 μm, and the mean particle size (capsule diameter) of the latent curing agent was 4 μm. The active temperature of the coating solution was 115° C. A connection structure was obtained in the same manner as Example 1 using this adhesive-attached metal foil tape, except that the solar cell used was a solar cell (thickness: 150 μm, size: 15 cm×15 cm) comprising a surface electrode (width: 2 mm×length: 15 cm, ten-point height of roughness profile Rzb: 18 μm, Ry: 20 μm) formed from silver glass paste on the surface of a silicon wafer.

Example 9

An adhesive-attached metal foil tape was obtained in the same manner as Example 8, except that plated plastic particles (polystyrene-based particles surface-covered with Ni/Au) having a particle size distribution width of 1-12 μm (mean particle size: 7 μm, non-classified) were added at 2 vol % to the adhesive layer-forming coating solution in Example 8. The adhesive-attached metal foil tape was used to obtain a connection structure in the same manner as Example 8.

Reference Example 1

An adhesive-attached metal foil tape was obtained in the same manner as Example 1, except that a double-side roughened electrolytic copper foil with a thickness of 75 μm (ten-point height of roughness profile on roughened surface Rza: 12 μm, maximum height Ry: 13 μm) was used as the metal foil, and the thickness of the adhesive layer was 52 μm. The adhesive-attached metal foil tape was used to obtain a connection structure in the same manner as Example 1.

Comparative Example 1

An adhesive-attached metal foil tape was obtained in the same manner as Example 1, except that a smooth electrolytic copper foil with a thickness of 35 μm (ten-point height of roughness profile on roughened surface Rza: 0.2 μm, maximum height Ry: 0.3 μm) was used as the metal foil. The adhesive-attached metal foil tape was used to obtain a connection structure in the same manner as Example 1.

<Evaluation>

The connection structures of Examples 1-9, Reference Example 1 and Comparative Example 1 were evaluated based on deltaF.F., in the following manner. The results are shown in Table 1.

[deltaF.F.]

The IV curve of the obtained connection structure was measured using a solar simulator (trade name: "WXS-155S-10" by Wacom Electric Co., Ltd., AM: 1.5 G). The connection structure was also allowed to stand for 1500 hours in a high-temperature, high-humidity atmosphere at 85° C., 85% RH, and the IV curve was then measured in the same manner. The F.F was derived from each IV curve, and the value of [F.F.(0 h)-F.F.(1500 h)], as the F.F. value before standing in the high-temperature, high-humidity atmosphere minus the F.F. value after standing in the high-temperature, high-humidity conditions, was recorded as Delta(F.F.) and used as the evaluation index. A Delta(F.F.) value of 0.2 or smaller is generally regarded as satisfactory connection reliability.

TABLE 1

| | Material | Metal foil Thickness (µm) | Formed surfaces | Roughened surface Ten-point height of roughness profile Rza (µm) | Maximum height Ry (µm) | Adhesive layer Thickness (µm) | t/Ry | Ten-point height of Rzb (µm) | Evaluation results Delta (F · F) |
|---|---|---|---|---|---|---|---|---|---|
| Example 1 | Copper foil | 35 | Both | 12 | 13 | 14 | 1.1 | 2 | 0.03 |
| Example 2 | Copper foil | 35 | Both | 12 | 13 | 14 | 1.1 | 2 | 0.03 |
| Example 3 | Copper foil | 100 | One | 12 | 13 | 14 | 1.1 | 2 | 0.03 |
| Example 4 | Aluminum foil | 20 | One | 12 | 13 | 14 | 1.1 | 2 | 0.03 |
| Example 5 | Copper foil | 75 | Both | 2 | 3 | 9 | 3 | 2 | 0.03 |
| Example 6 | Copper foil | 75 | Both | 9 | 10 | 18 | 1.8 | 2 | 0.03 |
| Example 7 | Copper foil | 75 | Both | 20 | 25 | 20 | 0.8 | 2 | 0.03 |
| Example 8 | Copper foil | 75 | Both | 20 | 25 | 45 | 1.8 | 18 | 0.03 |
| Example 9 | Copper foil | 75 | Both | 20 | 25 | 45 | 1.8 | 18 | 0.03 |
| Ref. Ex. 1 | Copper foil | 75 | Both | 12 | 13 | 52 | 4.0 | 2 | >0.2 |
| Comp. Ex. 1 | Copper foil (smooth) | 35 | Both | 0.2 | 0.3 | 14 | 47 | 2 | —(*1) |

(*1)Evaluation not possible due to lack of initial conduction.

Positioning of the electrode/adhesive layer/wiring member (metal foil) was easily accomplished in Examples 1-9 and Reference Example 1, while the connection temperature was a lower temperature (170° C.) than the conventional solder connection temperature and no warping of the board was observed. The connection structures of Examples 1-9, fabricated using adhesive-attached metal foil tape having a ratio t/Ry of 0.8-3 between the thickness t of the adhesive layer and the maximum height Ry of the roughened surface of the metal foil on which the adhesive layer had been formed, all exhibited sufficiently small Delta(F.F.) values, indicating excellent connection reliability. On the other hand, the connection structure of Reference Example 1, fabricated using adhesive-attached metal foil tape with a t/Ry of 4, did not readily exhibit initial conduction, and the deltaF.F. tended to be increased. Also, the connection structure of Comparative Example 1 obtained using a smooth electrolytic copper foil exhibited no initial conduction.

As explained above, the invention can provide an adhesive-attached metal foil tape whereby connection between electrodes and wiring members can be carried out in a single step, thus simplifying connection steps for electrical connection between solar cells, and whereby connection can be established at lower temperature (especially below 200° C.) than when using solder, thus helping to reduce thermal damage to solar cells. Using such an adhesive-attached metal foil tape allows highly reliable solar cell modules to be manufactured with high productivity.

Effect of the Invention

Thus, according to the invention it is possible to provide an electric conductor connecting member that can simplify the connection steps for electrical connection between mutually separate electric conductors, while also obtaining excellent connection reliability. According to the invention it is also possible to provide a connection structure and solar cell module whereby excellent productivity and high connection reliability can both be achieved.

What is claimed is:

1. A method of manufacturing a solar cell module comprising a plurality of solar cells with surface electrodes, the method comprising the steps of:
   preparing an electric conductor connecting member comprising a metal foil having a roughened surface on at least one main side, and an adhesive layer formed on the roughened surface of the metal foil, wherein the adhesive layer contains an epoxy resin and a latent curing agent, and wherein the thickness t (µm) of the adhesive layer is no greater than 3 times Ry, where Ry (µm) is the maximum height of the roughened surface on which the adhesive layer has been formed,
   situating part of the electric conductor connecting member and a first surface electrode, which a first solar cell has, with the roughened surface of the electric conductor connecting member and the first surface electrode facing each other via the adhesive layer, and hot pressing these for electrical connection and bonding of the metal foil and the first surface electrode,
   situating another part of the electric conductor connecting member and a second surface electrode, which a second solar cell has, with the roughened surface of the electric conductor connecting member and the second surface electrode facing each other via the adhesive layer, and hot pressing these for electrical connection and bonding of the metal foil and the second surface electrode, wherein hot pressing the part of the electric conductor connecting member and the first surface electrode and hot pressing the another part of the electric conductor connecting member and the second surface electrode are carried out simultaneously,
   wherein t, Rza, and Rzb satisfy the following equation:

$$0.90 \leq t/(Rza+Rzb) \leq 2.25$$

where Rza (µm) is the ten-point height of roughness profile on the roughened surface on which the adhesive layer has been formed and Rzb (µm) is the ten-point height of roughness profile on the side of the first surface electrode and the second surface electrode.

2. A method of manufacturing a solar cell module according to claim 1, wherein the adhesive layer comprises conductive particles.

3. A method of manufacturing a solar cell module according to claim 1, wherein
   the adhesive layer comprises conductive particles, and
   the mean particle size D (µm) of the conductive particles is no greater than Ry, where Ry (µm) is the maximum height on the roughened surface on which the adhesive layer has been formed.

4. A method of manufacturing a solar cell module according to claim 1, wherein
the adhesive layer comprises conductive particles, and
the maximum particle size $r_{max}$ (μm) of the conductive particles is no greater than the sum of Rza and Rzb, where Rza (μm) is the ten-point height of roughness profile on the roughened surface on which the adhesive layer has been formed and Rzb (μm) is the ten-point height of roughness profile on the side of the first surface electrode and the second surface electrode, which is in contact with the adhesive layer.

5. A method of manufacturing a solar cell module according to claim 1, wherein
the adhesive layer contains conductive particles,
a mean particle size D (μm) of the conductive particles is no greater than Ry, where Ry (μm) is the maximum height of the roughened surface on which the adhesive layer has been formed, and
a maximum particle size $r_{max}$ (μm) of the conductive particles is no greater than the sum of Rza and Rzb, where Rza (μm) is the ten-point height of roughness profile on the roughened surface on which the adhesive layer has been formed and Rzb (μm) is the ten-point height of roughness profile on the side of the first surface electrode and the second surface electrode, which is in contact with the adhesive layer.

6. A method of manufacturing a solar cell module according to claim 1, wherein
a mean particle size Dc (μm) of the latent curing agent is no greater than Ry, where Ry (μm) is the maximum height on the roughened surface on which the adhesive layer has been formed.

7. A method of manufacturing a solar cell module according to claim 1, wherein the metal foil is band-shaped.

8. A method of manufacturing a solar cell module according to claim 1, wherein the metal foil is one comprising at least one metal selected from among Cu, Ag, Au, Fe, Ni, Pb, Zn, Co, Ti, Mg, Sn and Al.

9. A method of manufacturing a solar cell module according to claim 1, wherein the ten-point height of roughness profile Rza (μm) on the roughened surface is no greater than 30 μm.

10. A method of manufacturing a solar cell module according to claim 1, wherein the metal foil is a copper foil or an aluminum foil.

11. A method of manufacturing a solar cell module according to claim 3, wherein a mean particle size Dc of the latent curing agent is smaller than a mean particle size D of the conductive particles, wherein both mean particle size D and mean particle size Dc are values determined using Formula 1, $D=\Sigma nd/\Sigma n$ wherein n is the number of particles with maximum diameter d.

* * * * *